United States Patent
Nonoyama et al.

(10) Patent No.: US 11,205,996 B2
(45) Date of Patent: Dec. 21, 2021

(54) OSCILLATION CIRCUIT, OSCILLATOR, AND OPERATION MODE SWITCHING METHOD OF OSCILLATION CIRCUIT

(71) Applicant: Seiko Epson Corporation, Toyko (JP)

(72) Inventors: Mihiro Nonoyama, Minowa-Machi (JP); Nobutaka Shiozaki, Shiojiri (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/158,091

(22) Filed: Jan. 26, 2021

(65) Prior Publication Data

US 2021/0234510 A1 Jul. 29, 2021

(30) Foreign Application Priority Data

Jan. 27, 2020 (JP) .............................. JP2020-010529

(51) Int. Cl.
*H03B 5/32* (2006.01)
*H03B 5/04* (2006.01)
*H03B 5/36* (2006.01)

(52) U.S. Cl.
CPC ................. *H03B 5/32* (2013.01); *H03B 5/04* (2013.01); *H03B 5/362* (2013.01)

(58) Field of Classification Search
CPC ............. H03B 5/32; H03B 5/362; H03B 5/04
USPC ................................... 331/176, 158, 167, 34
See application file for complete search history.

(56) References Cited

U.S. PATENT DOCUMENTS

| 8,963,650 B2 * | 2/2015 | Oishi | ...................... H03B 5/04 |
| | | | 331/176 |
| 2015/0116051 A1 * | 4/2015 | Terrovitis | ............... H03B 5/362 |
| | | | 331/158 |

FOREIGN PATENT DOCUMENTS

| JP | H09294021 A | 11/1997 |
| JP | 2006023102 A | 1/2006 |
| JP | 2006029948 A | 2/2006 |
| JP | 2010216998 A | 9/2010 |

* cited by examiner

*Primary Examiner* — Arnold M Kinkead
(74) *Attorney, Agent, or Firm* — Harness, Dickey & Pierce, P.L.C.

(57) ABSTRACT

A control circuit switches an oscillation circuit from a second operation mode to a first operation mode. When a first predetermined signal is detected and mode switching permission information indicates that the switching from the second operation mode to the first operation mode is permitted, then the oscillation circuit switches from the second operation mode to the first operation mode. When the first predetermined signal is not detected and the mode switching permission information indicates that the switching from the second operation mode to the first operation mode is not permitted, then the oscillation circuit continues in the second operation mode.

6 Claims, 6 Drawing Sheets

OSCILLATION CIRCUIT, OSCILLATOR, AND OPERATION MODE SWITCHING METHOD OF OSCILLATION CIRCUIT

The present application is based on, and claims priority from JP Application Serial Number 2020-010529, filed Jan. 27, 2020, the disclosure of which is hereby incorporated by reference herein in its entirety.

BACKGROUND

1. Technical Field

The present disclosure relates to an oscillation circuit, an oscillator, and an operation mode switching method of an oscillation circuit.

2. Related Art

An oscillator using a resonator such as a crystal resonator (piezoelectric resonator) and a micro electro mechanical systems (MEMS) resonator has been developed. Such an oscillator may have a special operation mode (for example, an operation mode for inspection or an operation mode for rewriting setting information) used during manufacturing in addition to an operation mode used during normal use.

On the other hand, since the number of terminals cannot be increased in order to reduce a size of the oscillator, it may be difficult to provide a dedicated terminal for a special operation mode. For example, JP-A-9-294021 discloses a switch circuit that also serves as an analog/digital input/output terminal and is used in a plurality of operation modes.

When the operation mode of the oscillator is switched according to a potential or a signal input to a terminal, the operation mode may be erroneously switched due to the influence of unstable power supply voltage, lightning strike, physical impact, or the like.

SUMMARY

An oscillation circuit according to an aspect of the present disclosure is an oscillation circuit that has a first operation mode and a second operation mode, the oscillation circuit including: a detection circuit configured to detect input of a first predetermined signal; a control circuit configured to control switching from the second operation mode to the first operation mode; and a non-volatile memory storing mode switching permission information, in which the control circuit is configured to: when the input of the first predetermined signal is detected by the detection circuit and the mode switching permission information indicates that the switching from the second operation mode to the first operation mode is permitted in the second operation mode, switch from the second operation mode to the first operation mode, and when the input of the first predetermined signal is not detected by the detection circuit and the mode switching permission information indicates that the switching from the second operation mode to the first operation mode is not permitted in the second operation mode, continue the second operation mode.

An oscillator according to an aspect of the present disclosure includes: the oscillation circuit according to the aspect; and a resonator coupled to the oscillation circuit.

An operation mode switching method of an oscillation circuit according to an aspect of the present disclosure is an operation mode switching method of an oscillation circuit, the oscillation circuit having a first operation mode and a second operation mode and including a non-volatile memory, the operation mode switching method including: when input of a first predetermined signal is detected and mode switching permission information stored in the non-volatile memory indicates that switching from the second operation mode to the first operation mode is permitted in the second operation mode, switching from the second operation mode to the first operation mode; and when the input of the first predetermined signal is not detected and the mode switching permission information indicates that the switching from the second operation mode to the first operation mode is not permitted in the second operation mode, continuing the second operation mode.

DESCRIPTION OF EXEMPLARY EMBODIMENTS

Hereinafter, embodiments of the present disclosure will be described in detail with reference to the drawings. The embodiments described below do not in anyway limit contents of the present disclosure described in the appended claims. Not all configurations described below are necessarily essential components of the present disclosure.

1. First Embodiment

Figure 1:
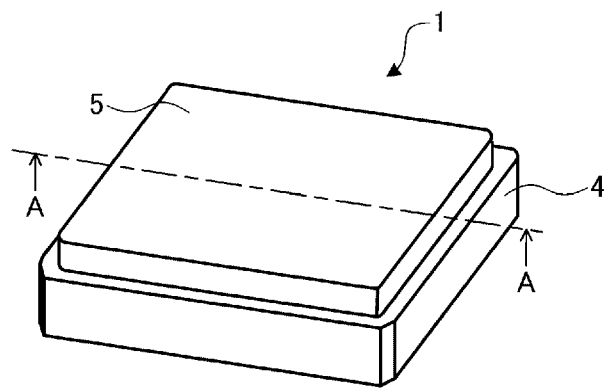
FIG. 1 is a perspective view of an oscillator according to an embodiment.
Figure 2:
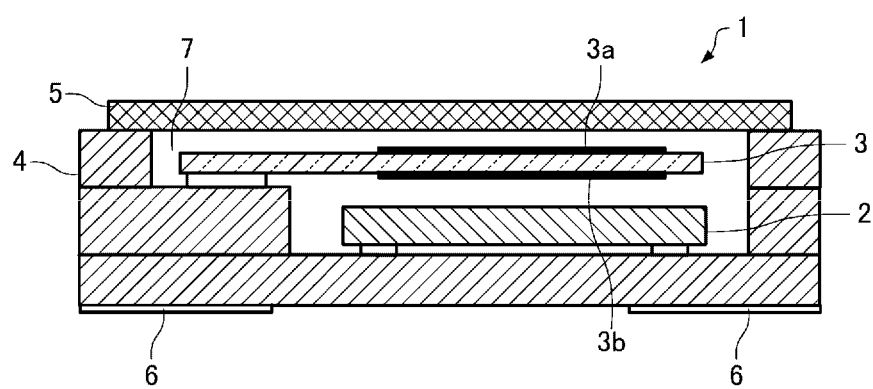
FIG. 2 is a cross-sectional view of the oscillator according to the present embodiment.
Figure 3:
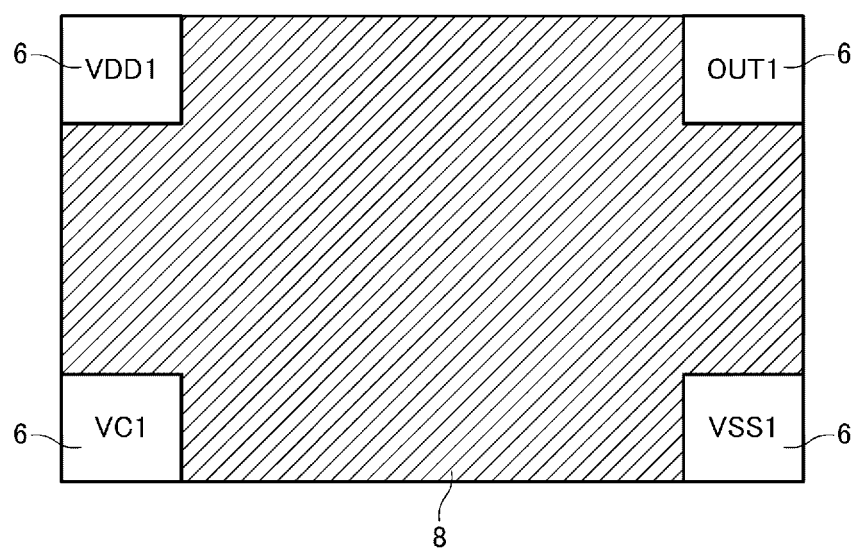
FIG. 3 is a bottom view of the oscillator according to the present embodiment.

FIGS. 1, 2, and 3 are views showing an example of a structure of an oscillator 1 according to an embodiment. FIG. 1 is a perspective view of the oscillator 1. FIG. 2 is a cross-sectional view taken along the line A-A of FIG. 1. FIG. 3 is a bottom view of the oscillator 1.

As shown in FIGS. 1, 2 and 3, the oscillator 1 includes an oscillation circuit 2, a resonator 3, a package 4, a lid 5, and a plurality of external terminals 6. In the present embodiment, the resonator 3 is a crystal resonator using a crystal as a substrate material, for example, an AT cut quartz crystal resonator, a tuning fork type quartz crystal resonator, or the like. The resonator 3 may be a surface acoustic wave (SAW) resonator or a micro electro mechanical system (MEMS) resonator. Further, as the substrate material of the resonator 3, in addition to a quartz crystal, a piezoelectric material, such as a piezoelectric single crystal, for example, lithium tantalate and lithium niobate, and a piezoelectric ceramic, for example, lead zirconate titanate, or a silicon semiconductor material can be used. As an exciting method of the resonator 3, the one based on a piezoelectric effect may be used, or an electrostatic drive based on a Coulomb force may be used. Further, in the present embodiment, the oscillation circuit 2 is implemented by a one-chip integrated circuit. However, at least a part of the oscillation circuit 2 may be formed by discrete components.

The package 4 accommodates the oscillation circuit 2 and the resonator 3 in the same space. Specifically, the package 4 is provided with a recess portion, and the recess portion is covered with the lid 5 to form a storage chamber 7. In the package 4 or on a surface of the recess portion, there is provided wiring (not shown) which respectively electrically couples two terminals of the oscillation circuit 2, specifically, an XI terminal and an XO terminal in FIG. 4 described later, and two excitation electrodes 3a, 3b of the resonator 3. Further, inside the package 4 or on the surface of the recess portion, there is provided wiring (not shown) which electrically couples each terminal of the oscillation circuit 2 and each external terminal 6 provided on a bottom surface of the package 4. The package 4 is not limited to a configuration in which the oscillation circuit 2 and the resonator 3 are accommodated in the same space. For example, the package 4 may be a so-called H-shaped package in which the oscillation circuit 2 is mounted on one surface of the substrate of the package and the resonator 3 is mounted on the other surface.

The resonator 3 includes the excitation electrodes 3a, 3b made of a metal and provided on a front surface and a back surface thereof, respectively, and oscillates at a desired frequency according to a shape and a mass of the resonator 3 including the excitation electrodes 3a, 3b.

As shown in FIG. 3, the oscillator 1 of the present embodiment is provided with four external terminals 6 on a bottom surface thereof, specifically, on a back surface of the package 4. The external terminals 6 include an external terminal VDD1 which is a power supply terminal, an external terminal VSS1 which is a ground terminal, an external terminal VC1 which is a terminal to which a signal for controlling a frequency of the oscillation circuit 2 is input, and an external terminal OUT1 which is an output terminal from which an oscillation signal is output. A power supply voltage is supplied to the external terminal VDD1, and the external terminal VSS1 is grounded.

Figure 4:
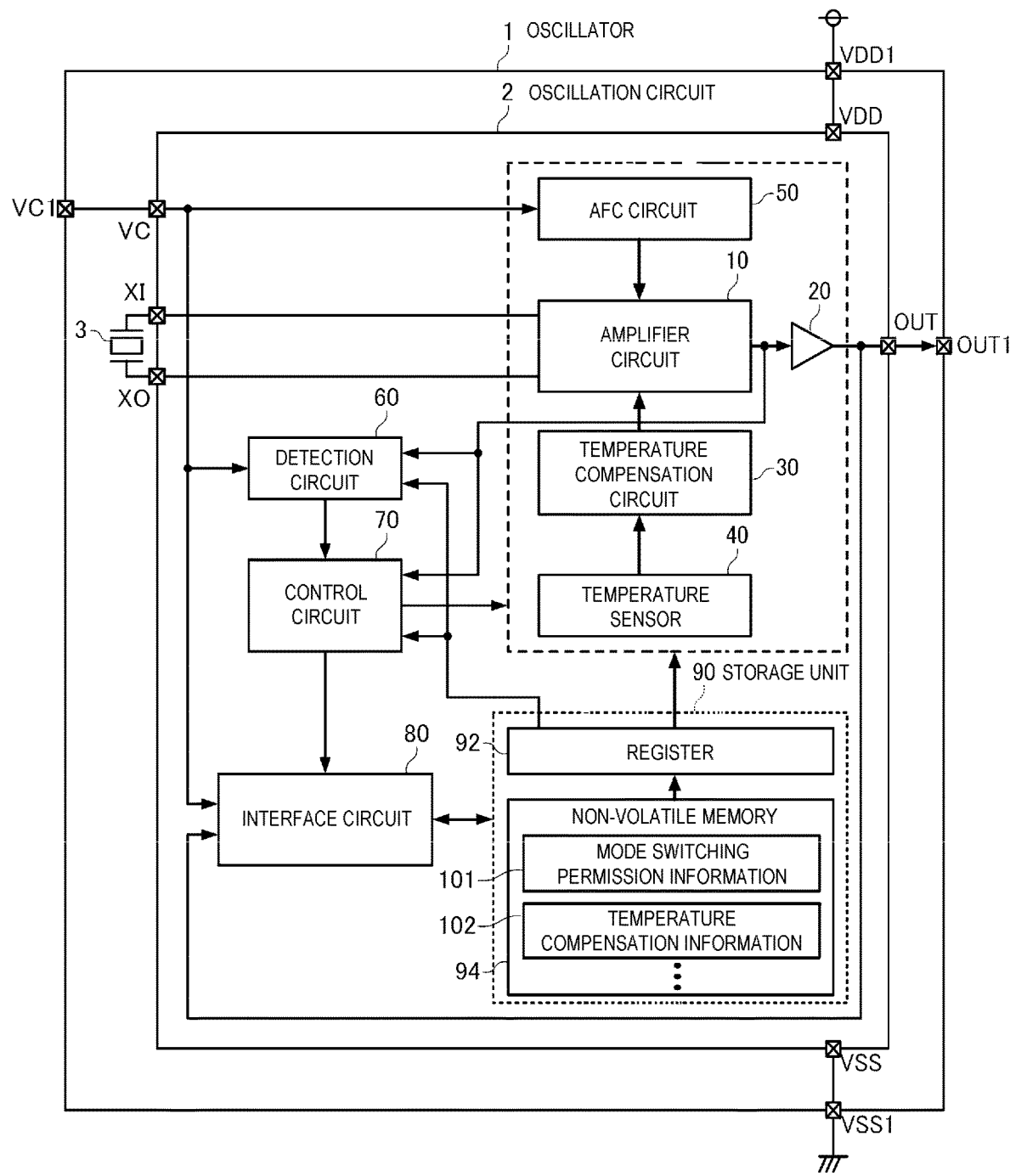
FIG. 4 is a functional block diagram of the oscillator according to the present embodiment.

FIG. 4 is a functional block diagram of the oscillator 1 according to the present embodiment. As shown in FIG. 4, the oscillator 1 of the present embodiment includes the oscillation circuit 2 and the resonator 3. The oscillation circuit 2 includes a VDD terminal, a VSS terminal, an OUT terminal, a VC terminal, the XI terminal, and the XO terminal which are serving as external coupling terminals. The VDD terminal, the VSS terminal, the OUT terminal, and the VC terminal are respectively electrically coupled to the external terminal VDD1, the external terminal VSS1, the external terminal OUT1, and the external terminal VC1, which are the four external terminals 6 of the oscillator 1 shown in FIG. 3. The XI terminal is electrically coupled to the excitation electrode 3a, which is one end of the resonator 3, and the XO terminal is electrically coupled to the excitation electrode 3b, which is the other end of the resonator 3.

In the present embodiment, the oscillation circuit 2 includes an amplifier circuit 10, an output buffer 20, a temperature compensation circuit 30, a temperature sensor 40, an automatic frequency control (AFC) circuit 50, a detection circuit 60, a control circuit 70, an interface circuit 80, and a storage unit 90. The oscillation circuit 2 may have a configuration in which some of these elements are omitted or changed, or other elements are added.

The oscillation circuit 2 has a first operation mode and a second operation mode as operation modes. The first operation mode is an interface mode in which the interface circuit 80 can communicate with an external device (not shown). The second operation mode is a normal operation mode in which an oscillation signal can be output from the external terminal OUT1 or a test mode in which the oscillator 1 and the oscillation circuit 2 are inspected. The test mode includes, for example, a test mode in which a temperature compensation voltage output from the temperature compensation circuit 30 is output from the external terminal OUT1 or the external terminal VC1, a test mode in which a temperature signal output from the temperature sensor 40 is output from the external terminal OUT1 or the external terminal VC1, and a test mode in which the temperature compensation voltage supplied to the amplifier circuit 10 is input from the external terminal VC1 and a frequency of the oscillation signal output from the external terminal OUT1 is measured.

The amplifier circuit 10 is a circuit that is electrically coupled to the XI terminal and the XO terminal, amplifies a signal output from the resonator 3 by an amplifier element and supplies the signal to the resonator 3 such that the resonator 3 is oscillated. The amplifier element may be, for example, a bipolar transistor or a logic inversion element. The amplifier circuit 10 performs adjustment based on data stored in a register 92 such that an oscillation frequency at a reference temperature such as 25° C. becomes a target frequency.

The oscillation signal output by the amplifier circuit 10 is input to the output buffer 20. An output signal of the output buffer 20 is output to the outside of the oscillator 1 via the OUT terminal and the external terminal OUT1. When the operation mode of the oscillation circuit 2 is the first operation mode, the output of the output buffer 20 has high impedance. Further, when the operation mode of the oscillation circuit 2 is the second operation mode, the output buffer 20 outputs an oscillation signal based on the data stored in the register 92, and the output becomes low level or high impedance. Further, the output buffer 20 is controlled by the control circuit 70 such that the output of the output buffer 20 is fixed at a low level within a predetermined period after the power supply voltage is supplied to the external terminal VDD1, and the oscillation signal is output when the predetermined period ends. For example, the predetermined period may be a time until the number of pulses of the oscillation signal output by the amplifier circuit 10 reaches a predetermined number.

The temperature compensation circuit 30 generates, based on the temperature signal output from the temperature sensor 40 and temperature compensation information 102, a temperature compensation voltage for correcting a frequency temperature characteristic of the oscillation signal output from the amplifier circuit 10, and supplies the temperature compensation voltage to the amplifier circuit 10.

The temperature sensor 40 detects a temperature of the oscillation circuit 2 and outputs a temperature signal of a voltage corresponding to the temperature, and is implemented by, for example, a circuit utilizing a temperature characteristic of a bandgap reference circuit.

The AFC circuit 50 generates a frequency control voltage for controlling the oscillation frequency of the amplifier circuit 10 according to a voltage level of a frequency control signal input from the external terminal VC1 and supplied via the VC terminal, and supplies the frequency control voltage to the amplifier circuit 10. That is, the frequency of the oscillation signal output from the external terminal OUT1 changes according to the voltage level of the frequency control signal input from the external terminal VC1.

The detection circuit 60 detects input of a first predetermined signal from the external terminal VC1. The first predetermined signal is, for example, a signal having a predetermined data length including a high level and a low level in a predetermined pattern. The detection circuit 60 measures the number of pulses of the oscillation signal output from the amplifier circuit 10 and included in each of the high level period and the low level period of the signal input from the external terminal VC1, and when the number of pulses matches that of the predetermined pattern, the first predetermined signal is detected. Therefore, the detection circuit 60 outputs a signal indicating that the first predetermined signal is detected to the control circuit 70.

The control circuit 70 controls switching of the operation mode of the oscillation circuit 2 from the second operation mode to the first operation mode. Specifically, when the input of the first predetermined signal is detected by the detection circuit 60 and mode switching permission information 101 indicates that the switching from the second operation mode to the first operation mode is permitted in the second operation mode, the control circuit 70 switches from the second operation mode to the first operation mode. Further, when the input of the first predetermined signal is not detected by the detection circuit 60 and the mode switching permission information 101 indicates that the switching from the second operation mode to the first operation mode is not permitted in the second operation mode, the control circuit 70 continues the second operation mode.

When the mode switching permission information 101 indicates that the switching from the second operation mode to the first operation mode is permitted, the detection circuit 60 performs processing of detecting the input of the first predetermined signal, and when the mode switching permission information 101 indicates that the switching from the second operation mode to the first operation mode is not permitted, the detection circuit 60 may not perform the processing of detecting the input of the first predetermined signal.

The interface circuit 80 communicates with an external device (not shown) via the external terminals OUT1, VC1 in the interface mode, which is the first operation mode. Specifically, the interface circuit 80 synchronizes with a serial clock signal input from the external terminal OUT1 and supplied via the OUT terminal, and receives a serial data signal input from the external terminal VC1 terminal and supplied via the VC terminal. The interface circuit 80 writes and reads various types of information to and from the storage unit 90 in response to the serial data signal.

The operation mode of the oscillation circuit 2 is switched from the first operation mode to the second operation mode when a predetermined command is received from the external device by the interface circuit 80 in the first operation mode. Specifically, when the interface circuit 80 receives the predetermined command as the serial data signal, the interface circuit 80 rewrites a predetermined bit contained in the register to a value corresponding to the predetermined command. Accordingly, the operation mode of the oscillation circuit 2 is switched from the serial interface mode, which is the first operation mode, to the normal operation mode or the test mode, which is the second operation mode. If the predetermined command is a command instructing a transition to the normal operation mode, the operation mode of the oscillation circuit 2 is switched from the serial interface mode to the normal operation mode. Further, if the predetermined command is a command instructing a transition to the test mode, the operation mode of the oscillation circuit 2 is switched from the serial interface mode to the test mode.

In the present embodiment, the interface circuit 80 is, for example, an interface circuit of a 2-wire bus such as an inter-integrated circuit ($I^2C$) bus, and may be an interface circuit of a 3-wire bus or a 4-wire bus such as a serial peripheral interface (SPI) bus.

The storage unit 90 is a circuit that stores various types of information, and includes the register 92 and a non-volatile memory 94 such as a metal oxide nitride oxide silicon (MONOS) type memory and an electrically erasable programmable read-only memory (EEPROM). In a manufacturing process of the oscillator 1, the various types of information such as the mode switching permission information 101 and the temperature compensation information 102 are stored in the non-volatile memory 94. Then, when the power supply voltage is supplied to the external terminal VDD1, the various types of information stored in the non-volatile memory 94 is transferred to the register 92, and the various information stored in the register 92 is appropriately supplied to each circuit. For example, the mode switching permission information 101 transferred from the non-volatile memory 94 to the register 92 is supplied to the detection circuit 60 and the control circuit 70. Further, the temperature compensation information 102 transferred from the non-volatile memory 94 to the register 92 is supplied to the temperature compensation circuit 30.

Figure 5:
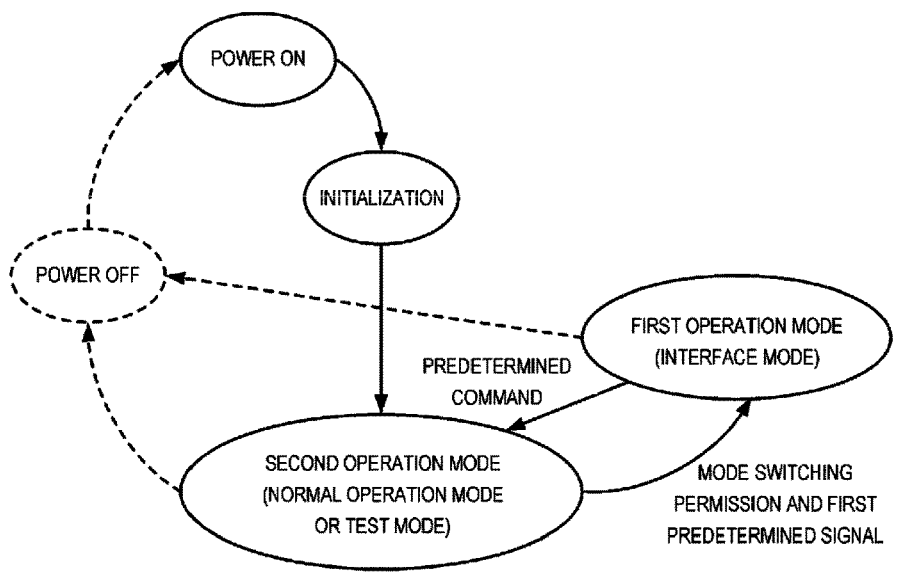
FIG. 5 is a diagram showing a state transition of an oscillator according to a first embodiment.

FIG. 5 is a diagram showing a state transition of the oscillator 1 according to the first embodiment. Further, FIGS. 6 and 7 are diagrams showing an example of signal waveforms of the VC terminal and the OUT terminal at the time of state transition of the oscillation circuit 2.

Figure 6:
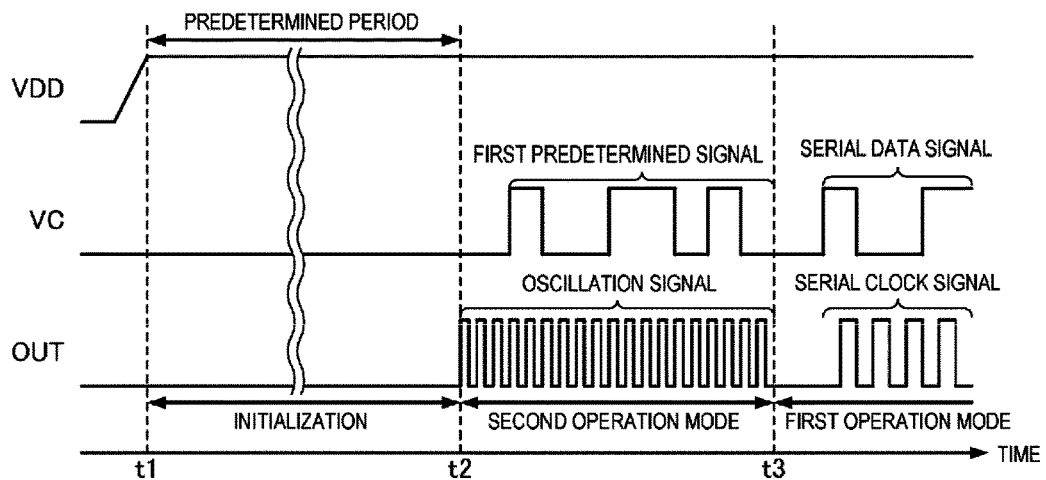
FIG. 6 is a diagram showing an example of signal waveforms of a VC terminal and an OUT terminal at the time of state transition of an oscillation circuit.
Figure 7:
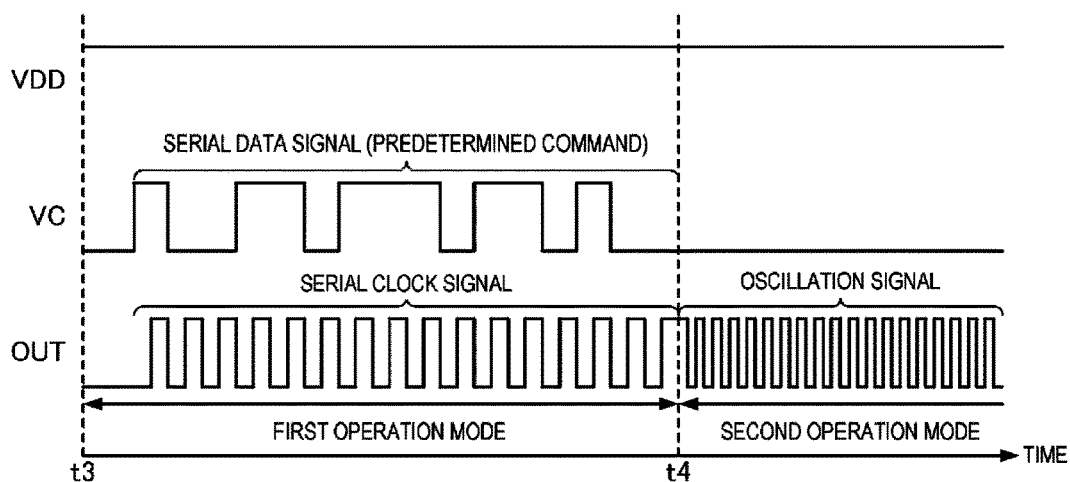
FIG. 7 is a diagram showing an example of signal waveforms of the VC terminal and the OUT terminal at the time of state transition of the oscillation circuit.

As shown in FIGS. 5 and 6, when a power supply of the oscillator 1 is turned on, that is, when a power supply voltage is supplied to the external terminal VDD1, and a voltage of the VDD terminal rises from 0 V and reaches a predetermined voltage value, the oscillation circuit 2 performs initialization within a predetermined period. The initialization includes transfer of the various types of information stored in the non-volatile memory 94 to the register 92, supply of each type of information transferred to the register 92 to each circuit, and start of an oscillation operation of the amplifier circuit 10. As shown in FIG. 6, the predetermined period during which the initialization is performed is, for example, a period from a time t1 when the voltage of the VDD terminal reaches the predetermined voltage value to a predetermined time t2 after the oscillation operation of the amplifier circuit 10 stabilizes. Since the oscillation signal output from the amplifier circuit 10 is not stable in the predetermined period during which the initialization is performed, the output of the output buffer 20 is fixed at a low level. Accordingly, a voltage of the OUT terminal is also fixed at a low level, and the oscillation signal is not output from the external terminal OUT1.

As shown in FIGS. 5 and 6, when the initialization within the predetermined period is completed, the operation mode of the oscillation circuit 2 is switched from the initialization to the normal operation mode which is the second operation mode. Accordingly, the oscillation signal is output from the output buffer 20, and as shown in FIG. 6, the oscillation signal is output from the OUT terminal. Then, the oscillation signal is output from the external terminal OUT1.

As shown in FIGS. 5 and 6, when the mode switching permission information 101 indicates that the switching from the second operation mode to the first operation mode is permitted in the second operation mode, and the first predetermined signal is input from the external terminal VC1 to the oscillation circuit 2 via the VC terminal, at a time t3, the operation mode of the oscillation circuit 2 is switched from the normal operation mode, which is the second operation mode, to the interface mode, which is the first operation mode. Accordingly, the output of the output buffer 20 becomes high impedance, and the serial clock signal can be input from the external terminal OUT1. Then, as shown in FIG. 6, in the first operation mode, the interface circuit 80 synchronizes with the serial clock signal input from the external terminal OUT1 to the oscillation circuit 2 via the OUT terminal, and receives the serial data signal input from the external terminal VC1 to the oscillation circuit 2 via the VC terminal.

When the mode switching permission information 101 indicates that the switching from the second operation mode to the first operation mode is not permitted in the second operation mode, even though the first predetermined signal is input to the oscillation circuit 2, the operation mode of the oscillation circuit 2 is not switched from the second operation mode to the first operation mode, and the second operation mode is continued.

As shown in FIGS. 5 and 7, when the operation mode of the oscillation circuit 2 is the first operation mode, and a predetermined command is input as the serial data signal, in response to the predetermined command, at a time t4, the operation mode of the oscillation circuit 2 is switched from the interface mode, which is the first operation mode, to the normal operation mode or the test mode, which is the second operation mode.

Although not shown, even after the time t4, when the operation mode of the oscillation circuit 2 is the second operation mode and the first predetermined signal is input, the operation mode is switched from the second operation mode to the first operation mode, and when the operation mode of the oscillation circuit 2 is the first operation mode and the predetermined command is input, the operation mode is switched from the first operation mode to the second operation mode. As shown in FIG. 5, when the operation mode of the oscillation circuit 2 is the first operation mode or the second operation mode, after the power supply of the oscillator 1 is turned off, that is, after the voltage of the external terminal VDD1 and the VDD terminal drops from the predetermined voltage value to 0 V, even when the power supply of the oscillator 1 is turned on, the oscillation circuit 2 switches to the second operation mode after the initialization. Then, when the mode switching permission information 101 indicates that the switching from the second operation mode to the first operation mode is permitted, according to the first predetermined signal or the predetermined command, the second operation mode and the first operation mode are switched.

Figure 8:
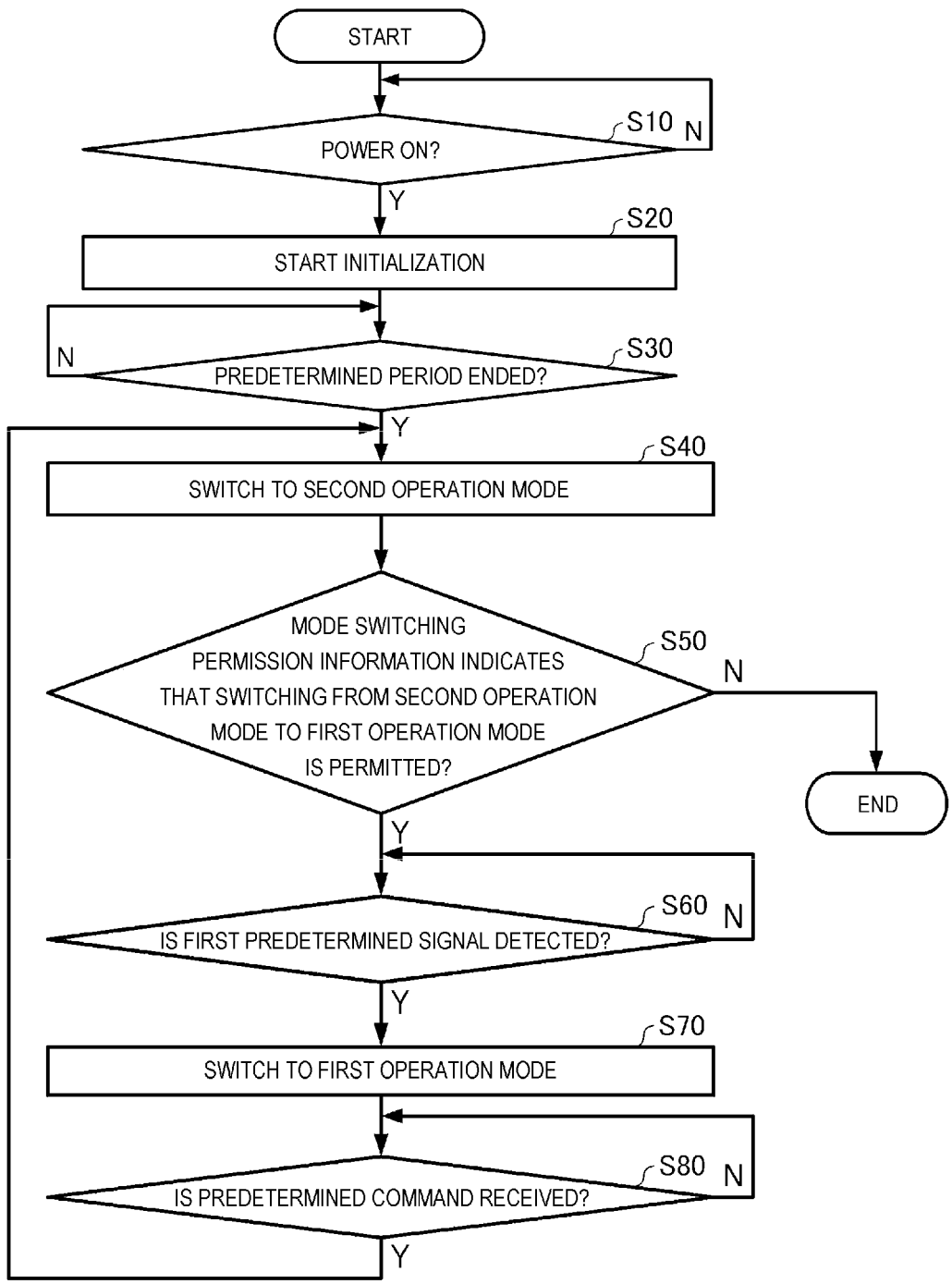
FIG. 8 is a flowchart showing an example of a procedure of an operation mode switching method of the oscillation circuit according to the first embodiment.

FIG. 8 is a flowchart showing an example of a procedure of an operation mode switching method of the oscillation circuit 2 according to the first embodiment.

When the power supply of the oscillator 1 is turned on (Y in step S10), the oscillation circuit 2 starts the initialization (step S20).

When the predetermined period during which the initialization is performed ended (Y in step S30), the oscillation circuit 2 switches the operation mode to the second operation mode (step S40).

When the mode switching permission information 101 indicates that the switching from the second operation mode to the first operation mode is not permitted in the second operation mode (N in step S50), the oscillation circuit 2 completes switching processing of the operation mode. That is, after that, the oscillation circuit 2 continues the second operation mode.

When the mode switching permission information 101 indicates that the switching from the second operation mode to the first operation mode is permitted in the second operation mode (Y in step S50), and the first predetermined signal is detected (Y in step S60), the oscillation circuit 2 switches the operation mode from the second operation mode to the first operation mode (step S70).

When the predetermined command is received in the first operation mode (Y in step S80), the oscillation circuit 2 switches the operation mode from the first operation mode to the second operation mode (step S40), and repeats processing of steps S40 to S80.

In the oscillator 1 of the first embodiment described above, in the oscillation circuit 2, when the input of the first predetermined signal is not detected by the detection circuit 60 and the mode switching permission information 101 stored in the non-volatile memory 94 indicates that the switching from the second operation mode to the interface mode, which is the first operation mode, is not permitted in the normal operation mode or the test mode which is the second operation mode, the control circuit 70 continues the second operation mode. Therefore, according to the oscillator 1 of the first embodiment, in the oscillation circuit 2, even though a signal having the same pattern as that of the first predetermined signal is suddenly input, when the mode switching permission information 101 stored in the non-volatile memory 94 indicates that the switching from the second operation mode to the first operation mode is not permitted, the operation mode is not switched from the second operation mode to the first operation mode. Therefore, the possibility of erroneously switching the operation mode can be reduced. As described above, the oscillator 1 of the first embodiment includes the oscillation circuit 2 in which the possibility of erroneously switching the operation mode can be reduced, so that the reliability can be improved.

Further, in the oscillator 1 of the first embodiment, in the oscillation circuit 2, when the input of the first predetermined signal is detected by the detection circuit 60 and the mode switching permission information 101 stored in the non-volatile memory 94 indicates that the switching from the second operation mode to the first operation mode is permitted in the second operation mode, the control circuit 70 switches from the second operation mode to the first operation mode. Therefore, according to the oscillator 1 of the first embodiment, in the oscillation circuit 2, when the mode switching permission information 101 stored in the non-volatile memory 94 indicates that the switching from the second operation mode to the first operation mode is permitted, according to the first predetermined signal, the operation mode can be easily switched from the second operation mode to the first operation mode.

Further, in the oscillator 1 of the first embodiment, in the oscillation circuit 2, the operation mode is switched from the first operation mode to the second operation mode when the predetermined command is received from the external device by the interface circuit 80. Therefore, according to the oscillator 1 of the first embodiment, in the oscillation circuit 2, when the mode switching permission information 101 stored in the non-volatile memory 94 indicates that the switching from the second operation mode to the first operation mode is permitted, according to the first predetermined signal or the predetermined command, the second operation mode and the first operation mode can be easily switched. For example, the predetermined command for a predetermined inspection is input in the interface mode which is the first operation mode, and then the operation mode is switched to the second operation mode, the predetermined inspection is performed in the test mode which is the second operation mode, and when the inspection is completed, it is possible to input the first predetermined signal and switch to the first operation mode again to perform another inspection. As described above, according to the oscillator 1 of the first embodiment, various inspections can be performed with the power supply of the oscillation circuit 2 turned on, and therefore a time loss caused by turning the power supply on and off for each inspection is eliminated, and an inspection time can be shortened.

By setting an initial value of each bit of the non-volatile memory 94, for example, 0 to a value at which the mode switching permission information 101 indicates that the switching from the second operation mode to the first operation mode is permitted, in an inspection process before shipment of the oscillator 1, it is possible to adjust the oscillation frequency and perform various inspections by switching the operation mode of the oscillation circuit 2 between the interface mode, which is the first operation mode, and the test mode, which is the second operation mode. Then, when the inspection of the oscillator 1 before shipment is completed, a value, for example, 1 inverted to a predetermined bit of the non-volatile memory 94 is written, and is taken as a value at which the mode switching permission information 101 indicates that the switching from the second operation mode to the first operation mode is not permitted, so that after the oscillator 1 is shipped, a risk of the oscillation circuit 2 erroneously transitioning to the test mode is reduced. By using the non-volatile memory 94 as a one time programmable (OTP) memory, after the oscillator 1 is shipped, the mode switching permission information 101 cannot be rewritten, and the risk of the oscillation circuit 2 erroneously transitioning to the test mode is further reduced.

2. Second Embodiment

Compared with the oscillator 1 according to the first embodiment, in the oscillator 1 according to a second embodiment, a state transition of the oscillation circuit 2 is different, and other configurations are the same. Hereinafter, the oscillator 1 according to the second embodiment is designated by the same reference numerals for the similar configuration as that of the first embodiment, the similar description as that of the first embodiment is omitted or simplified, and the contents different from the first embodiment will be mainly described.

Since a structure of the oscillator 1 according to the second embodiment is the same as the structure shown in FIGS. 1 to 3, the illustration and description thereof is omitted.

Further, since the functional block diagram of the oscillator 1 according to the second embodiment is the same as that of FIG. 4, the illustration and description thereof is omitted. However, in the second embodiment, functions of the detection circuit 60 and the control circuit 70 are different from those in the first embodiment.

The detection circuit 60 detects input of a second predetermined signal from the external terminal VC1 as in the first embodiment. The second predetermined signal is a signal different from the first predetermined signal. The second predetermined signal is, for example, a signal having a predetermined data length including a high level and a low level in a predetermined pattern. The detection circuit 60 measures the number of pulses of the oscillation signal output from the amplifier circuit 10 and included in each of the high level period and the low level period of the signal input from the external terminal VC1, and when the number of pulses matches that of the predetermined pattern, the second predetermined signal is detected. Therefore, the detection circuit 60 outputs a signal indicating that the second predetermined signal is detected to the control circuit 70.

The control circuit 70 controls switching of the operation mode of the oscillation circuit 2 from the second operation mode to the first operation mode as in the first embodiment. Specifically, when the input of the first predetermined signal is detected by the detection circuit 60 and the mode switching permission information 101 indicates that the switching from the second operation mode to the first operation mode is permitted in the second operation mode, the control circuit 70 switches from the second operation mode to the first operation mode. Further, when the input of the first predetermined signal is not detected by the detection circuit 60 and the mode switching permission information 101 indicates that the switching from the second operation mode to the first operation mode is not permitted in the second operation mode, the control circuit 70 continues the second operation mode.

Further, when the input of the second predetermined signal is detected by the detection circuit 60 within a predetermined period after a power supply voltage is supplied to the VC terminal of the oscillation circuit 2, the control circuit 70 switches the operation mode of the oscillation circuit 2 to the first operation mode regardless of the mode switching permission information 101.

Figure 9:
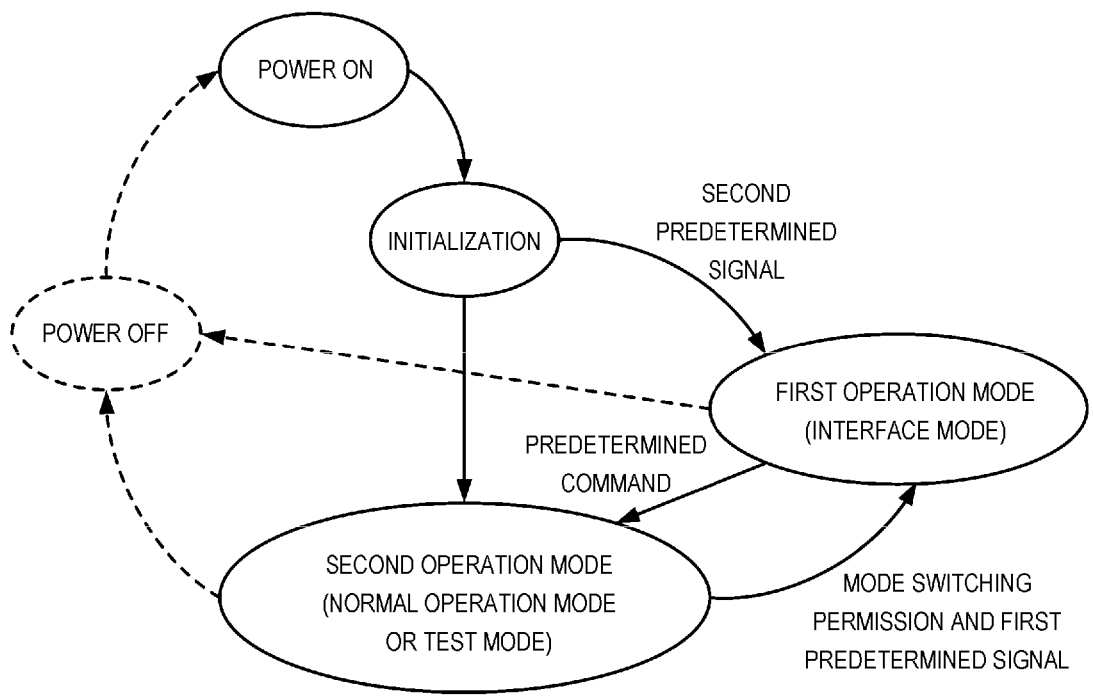
FIG. 9 is a diagram showing a state transition of the oscillator according to a second embodiment.

FIG. 9 is a diagram showing a state transition of the oscillator 1 according to the second embodiment. Further, FIG. 10 is a diagram showing an example of signal waveforms of the VC terminal and the OUT terminal at the time of state transition of the oscillation circuit 2.

Figure 10:
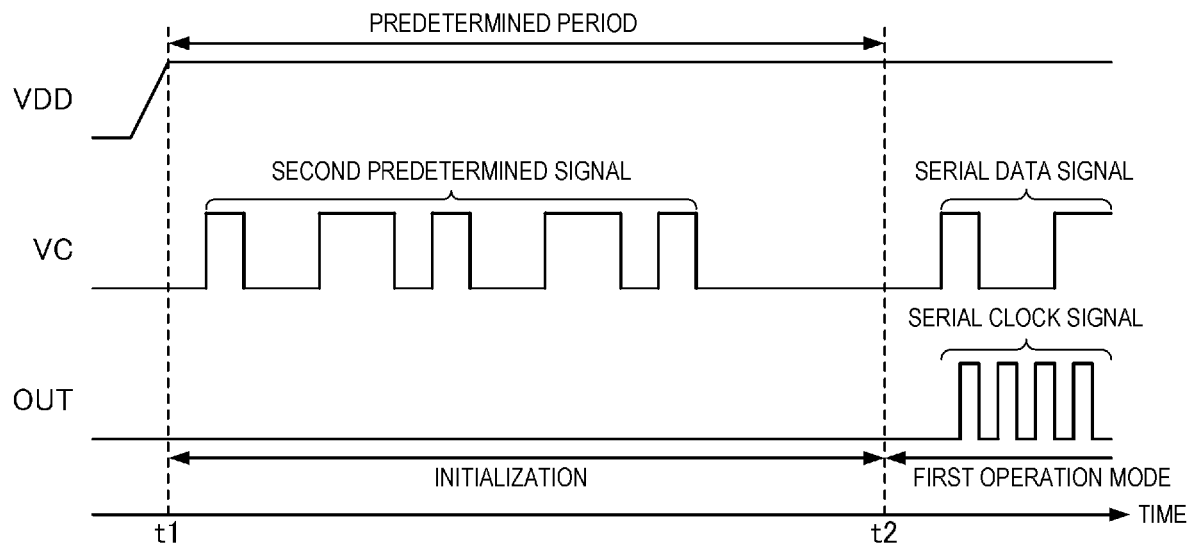
FIG. 10 is a diagram showing an example of signal waveforms of a VC terminal and an OUT terminal at the time of state transition of an oscillation circuit according to the second embodiment.

As shown in FIGS. 9 and 10, similar to the first embodiment, when a power supply of the oscillator 1 is turned on, that is, when a power supply voltage is supplied to the external terminal VDD1, and a voltage of the VDD terminal rises from 0 V and reaches a predetermined voltage value, the oscillation circuit 2 performs initialization within a predetermined period. Similar to the first embodiment, as shown in FIG. 10, the predetermined period during which the initialization is performed is, for example, a period from the time t1 when the voltage of the VDD terminal reaches the predetermined voltage value to the predetermined time t2 after the oscillation operation of the amplifier circuit 10 stabilizes.

When the second predetermined signal is input from the external terminal VC1 to the oscillation circuit 2 via the VC terminal within the predetermined period during which the initialization is performed, regardless of the mode switching permission information 101, the operation mode of the oscillation circuit 2 is switched from the initialization to the interface mode which is the first operation mode at the time t3. Accordingly, the output of the output buffer 20 becomes high impedance, and the serial clock signal can be input from the external terminal OUT1. Then, as shown in FIG. 10, in the first operation mode, the interface circuit 80 synchronizes with the serial clock signal input from the external terminal OUT1 to the oscillation circuit 2 via the OUT terminal, and receives the serial data signal input from the external terminal VC1 to the oscillation circuit 2 via the VC terminal.

As shown in FIG. 9, similar to the first embodiment, when the operation mode of the oscillation circuit 2 is the first operation mode, and a predetermined command is input as the serial data signal, in response to the predetermined command, the operation mode of the oscillation circuit 2 is switched from the interface mode, which is the first operation mode, to the normal operation mode or the test mode, which is the second operation mode. Since the example of the signal waveforms of the VC terminal and the OUT terminal when the operation mode of the oscillation circuit 2 is switched from the first operation mode to the second operation mode is similar to that in FIG. 7, the illustration and description thereof is omitted.

As shown in FIG. 9, similar to the first embodiment, when the mode switching permission information 101 indicates that the switching from the second operation mode to the first operation mode is permitted in the second operation mode, and the first predetermined signal is input from the external terminal VC1 to the oscillation circuit 2 via the VC terminal, the operation mode of the oscillation circuit 2 is switched from the normal operation mode or the test mode, which is the second operation mode, to the interface mode, which is the first operation mode. Since the example of the signal waveforms of the VC terminal and the OUT terminal when the operation mode of the oscillation circuit 2 is switched from the second operation mode to the first operation mode is similar to that in FIG. 6, the illustration and description thereof is omitted.

Similar to the first embodiment, when the mode switching permission information 101 indicates that the switching from the second operation mode to the first operation mode is not permitted in the second operation mode, even though the first predetermined signal is input to the oscillation circuit 2, the operation mode of the oscillation circuit 2 is not switched from the second operation mode to the first operation mode, and the second operation mode is continued.

In the first embodiment, since the mode switching permission information 101 indicates that the switching from the second operation mode to the first operation mode is not permitted after the oscillator 1 is shipped, the operation mode of the oscillation circuit 2 cannot be intentionally transited to the first operation mode. In contrast, in the second embodiment, the external device intentionally inputs the second predetermined signal to the external terminal VC1 within the predetermined period after the power supply of the oscillator 1 is turned on, and therefore the operation mode of the oscillation circuit 2 can be intentionally transited to the first operation mode. Therefore, the oscillation circuit 2 can be inspected even after the oscillator 1 is shipped. On the other hand, when a signal having the same pattern as that of the second predetermined signal is suddenly input to the external terminal VC1 within the predetermined period after the power supply of the oscillator 1 is turned on, the operation mode of the oscillation circuit 2 may be erroneously transited to the first operation mode. Therefore, in order to reduce a probability that a signal having the same pattern as that of the second predetermined signal is suddenly input to the external terminal VC1, the data length of the second predetermined signal is preferably larger than the data length of the first predetermined signal.

Figure 11:
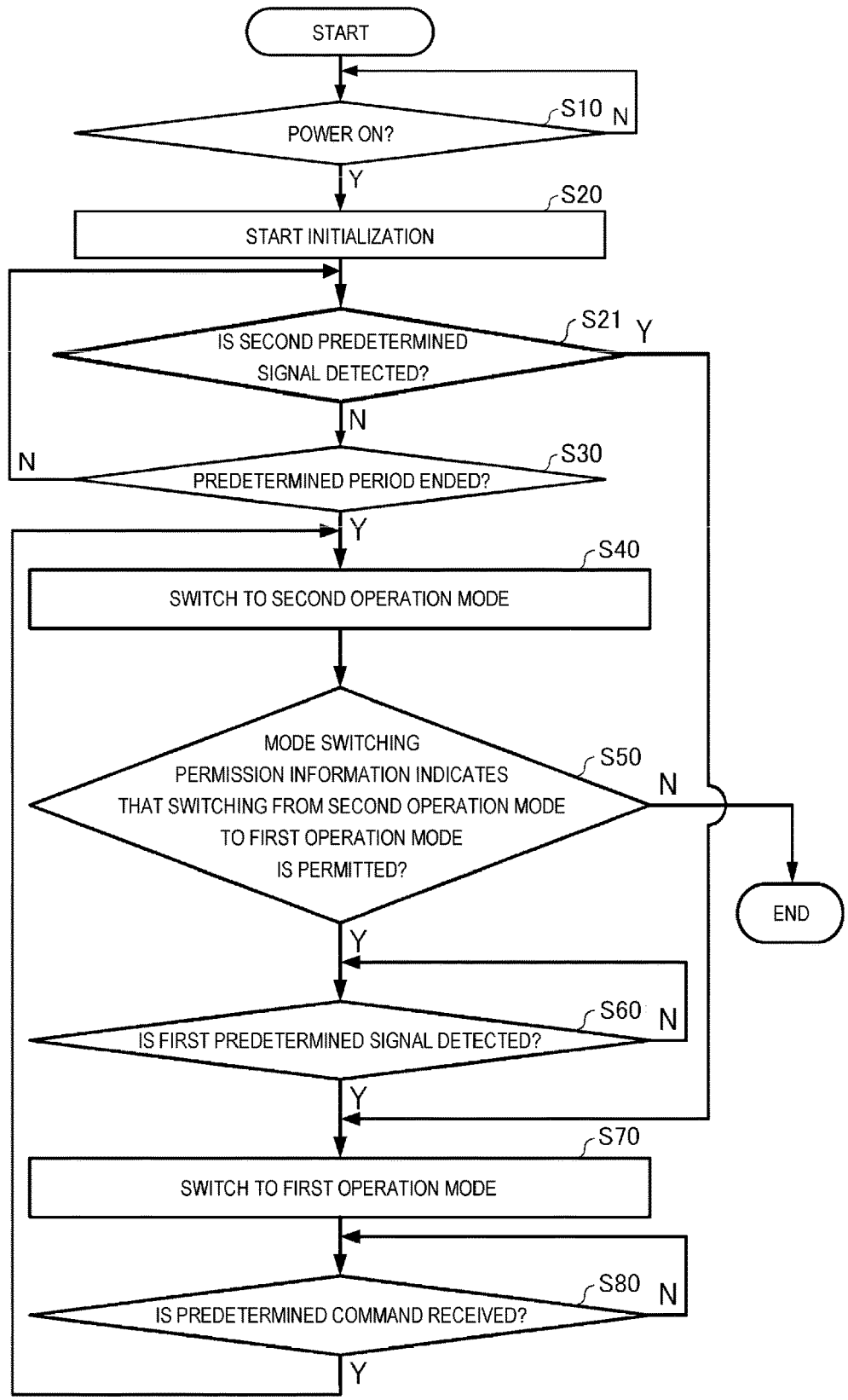
FIG. 11 is a flowchart showing an example of a procedure of an operation mode switching method of the oscillation circuit according to the second embodiment.

FIG. 11 is a flowchart showing an example of a procedure of an operation mode switching method of the oscillation circuit 2 according to the second embodiment. In FIG. 11, the same steps as in FIG. 8 are designated by the same reference numerals.

When the power supply of the oscillator 1 is turned on (Y in step S10), the oscillation circuit 2 starts the initialization (step S20).

When the second predetermined signal is not detected within the predetermined period during which the initialization is performed (N in step S21 and Y in step S30), the oscillation circuit 2 switches the operation mode to the second operation mode (step S40).

When the mode switching permission information 101 indicates that the switching from the second operation mode to the first operation mode is not permitted in the second operation mode (N in step S50), the oscillation circuit 2 completes the switching processing of the operation mode. That is, after that, the oscillation circuit 2 continues the second operation mode.

When the mode switching permission information 101 indicates that the switching from the second operation mode to the first operation mode is permitted in the second operation mode (Y in step S50), and the first predetermined signal is detected (Y in step S60), the oscillation circuit 2 switches the operation mode from the second operation mode to the first operation mode (step S70).

Further, when the second predetermined signal is detected within the predetermined period during which the initialization is performed (Y in step S21), the oscillation circuit 2 switches the operation mode to the first operation mode (step S70).

When the predetermined command is received in the first operation mode (Y in step S80), the oscillation circuit 2 switches the operation mode from the first operation mode to the second operation mode (step S40), and repeats processing of steps S40 to S80.

Since the oscillator 1 of the second embodiment described above includes components of the oscillator 1 similar to those of the first embodiment, the oscillator 1 has effects similar to those of the first embodiment.

Further, in the oscillator 1 of the second embodiment, in the oscillation circuit 2, when the input of the second predetermined signal is detected by the detection circuit 60 within the predetermined period after the power supply voltage is supplied, the control circuit 70 switches the operation mode to the first operation mode regardless of the mode switching permission information 101 stored in the non-volatile memory 94.

Therefore, according to the oscillator 1 of the second embodiment, in the oscillation circuit 2, even when the mode switching permission information 101 stored in the non-volatile memory 94 indicates that the switching from the second operation mode to the first operation mode is not permitted, by inputting the second predetermined signal within the predetermined period after the power supply voltage is supplied, the operation mode can be switched to the first operation mode. Further, according to the oscillator 1 of the second embodiment, in the oscillation circuit 2, beyond the predetermined period after the power supply voltage is supplied, even though the second predetermined signal is input, the operation mode is not switched to the first operation mode, and therefore a probability that the operation mode is erroneously switched is low.

Further, according to the oscillator 1 of the second embodiment, by setting the data length of the second predetermined signal larger than the data length of the first predetermined signal, a possibility that a signal having the same pattern as that of the second predetermined signal is suddenly input within the predetermined period after the power supply voltage is supplied is reduced, and therefore the possibility that the operation mode is erroneously switched to the first operation mode can be reduced.

3. Modification

In each of the above embodiments, the first operation mode of the oscillation circuit 2 is the normal operation mode or the test mode, but the first operation mode may be a mode in which the external terminal OUT1 has high impedance, a mode in which the external terminal OUT1 is fixed at a low level or a high level, a mode in which the oscillation circuit 2 stops the oscillation operation, or the like.

Further, in each of the above embodiments, the serial clock signal is input from the OUT terminal and the serial data signal is input from the VC terminal to the oscillation circuit 2, but the serial clock signal may be input from the VC terminal, and the serial data signal may be input from the OUT terminal. Further, the terminal into which the serial clock signal or the serial data signal is input may be a terminal other than these terminals.

Further, the oscillator 1 of each of the above embodiments is an oscillator such as a voltage controlled temperature compensated crystal oscillator (VC-TCXO) that has a temperature compensation function and a frequency control function, but the oscillator 1 may be a simple oscillator such as a simple packaged crystal oscillator (SPXO) that does not have a temperature compensation function or a frequency control function, an oscillator such as a temperature compensated crystal oscillator (TCXO) that has a temperature compensation function, an oscillator such as a voltage controlled crystal oscillator (VCXO) that has a frequency control function, an oscillator such as an oven controlled crystal oscillator (OCXO) that has a temperature control function, or the like.

The present disclosure is not limited to the present embodiment, and various modifications can be made within the scope of the gist of the present disclosure.

The above-described embodiments and modification are merely examples, and the present disclosure is not limited thereto. For example, it is also possible to appropriately combine each embodiment and each modification.

The present disclosure includes a configuration substantially the same as the configuration described in the embodiments, for example, a configuration having the same function, method and result, or a configuration having the same purpose and effect. Further, the present disclosure includes a configuration in which a non-essential portion of the configuration described in the embodiments is replaced. Further, the present disclosure includes a configuration having the same action and effect as the configuration described in the embodiments, or a configuration capable of achieving the same purpose. The present disclosure includes a configuration in which a known technique is added to the configuration described in the embodiments.

The following contents are derived from the above embodiments and modification.

An oscillation circuit according to an aspect is an oscillation circuit that has a first operation mode and a second operation mode, the oscillation circuit including: a detection circuit configured to detect input of a first predetermined signal; a control circuit configured to control switching from the second operation mode to the first operation mode; and a non-volatile memory storing mode switching permission information, in which the control circuit is configured to: when the input of the first predetermined signal is detected by the detection circuit and the mode switching permission information indicates that the switching from the second operation mode to the first operation mode is permitted in the second operation mode, switch from the second operation mode to the first operation mode, and when the input of the first predetermined signal is not detected by the detection circuit and the mode switching permission information indicates that the switching from the second operation mode to the first operation mode is not permitted in the second operation mode, continue the second operation mode.

In the oscillation circuit, even though a signal having the same pattern as that of the first predetermined signal is suddenly input, when the mode switching permission information stored in the non-volatile memory indicates that the switching from the second operation mode to the first operation mode is not permitted, the operation mode is not switched from the second operation mode to the first operation mode. Therefore, according to the oscillation circuit, a possibility of erroneously switching the operation mode can be reduced. Further, according to the oscillation circuit, when the mode switching permission information stored in the non-volatile memory indicates that the switching from the second operation mode to the first operation mode is permitted, according to the first predetermined signal, the operation mode can be easily switched from the second operation mode to the first operation mode.

In the oscillation circuit according to the aspect, the detection circuit may further detect input of a second predetermined signal different from the first predetermined signal, and the control circuit is configured to: when the input of the second predetermined signal is detected by the detection circuit within a predetermined period after a power supply voltage is supplied, switch the operation mode to the first operation mode regardless of the mode switching permission information.

According to the oscillation circuit, even when the mode switching permission information stored in the non-volatile memory indicates that the switching from the second operation mode to the first operation mode is not permitted, by inputting the second predetermined signal within the predetermined period after the power supply voltage is supplied, the operation mode can be switched to the first operation mode. Further, according to the oscillation circuit, beyond the predetermined period after the power supply voltage is supplied, even though the second predetermined signal is input, the operation mode is not switched to the first operation mode, and therefore a probability that the operation mode is erroneously switched is low.

In the oscillation circuit according to the aspect, a data length of the second predetermined signal may be larger than a data length of the first predetermined signal.

According to the oscillation circuit, a possibility that a signal having the same pattern as that of the second predetermined signal is suddenly input within the predetermined period after the power supply voltage is supplied is reduced, and therefore the possibility that the operation mode is erroneously switched to the first operation mode can be reduced.

The oscillation circuit according to the aspect may further includes: an interface circuit, in which the first operation mode is an interface mode in which the interface circuit communicates with an external device, and the second operation mode is a normal operation mode in which an oscillation signal is output or a test mode in which the oscillation circuit is inspected.

According to the oscillation circuit, a possibility of erroneously switching the operation mode from the normal operation mode or the inspection mode to the interface mode can be reduced.

In the oscillation circuit according to the aspect, the operation mode may be switched from the first operation mode to the second operation mode when a predetermined command is received from the external device by the interface circuit in the first operation mode.

According to the oscillation circuit, when the mode switching permission information stored in the non-volatile memory indicates that the switching from the second operation mode to the first operation mode is permitted, according to the first predetermined signal or the predetermined command, the second operation mode and the first operation mode can be easily switched.

An oscillator according to an aspect includes: the oscillation circuit according to the aspect; and a resonator coupled to the oscillation circuit.

According to the oscillator, since the oscillator includes the oscillation circuit in which the possibility of erroneously switching the operation mode can be reduced, the reliability can be improved.

An operation mode switching method of an oscillation circuit according to an aspect is an operation mode switching method of an oscillation circuit, the oscillation circuit having a first operation mode and a second operation mode and including a non-volatile memory, the operation mode switching method including: when input of a first predetermined signal is detected and mode switching permission information stored in the non-volatile memory indicates that switching from the second operation mode to the first operation mode is permitted in the second operation mode, switching from the second operation mode to the first operation mode; and when the input of the first predetermined signal is not detected and the mode switching permission information indicates that the switching from the second operation mode to the first operation mode is not permitted in the second operation mode, continuing the second operation mode.

In the operation mode switching method of the oscillation circuit, even though a signal having the same pattern as that of the first predetermined signal is suddenly input to the oscillation circuit, when the mode switching permission information stored in the non-volatile memory indicates that the switching from the second operation mode to the first operation mode is not permitted, the operation mode of the oscillation circuit is not switched from the second operation mode to the first operation mode. Therefore, according to the operation mode switching method of the oscillation circuit, a possibility of erroneously switching the operation mode of the oscillation circuit can be reduced. Further, according to the operation mode switching method of the oscillation circuit, when the mode switching permission information stored in the non-volatile memory indicates that the switching from the second operation mode to the first operation mode is permitted, according to the first predetermined signal, the operation mode of the oscillation circuit can be easily switched from the second operation mode to the first operation mode.

What is claimed is:

1. An oscillation circuit that has a first operation mode and a second operation mode, the oscillation circuit comprising:
   a detection circuit configured to detect input of a first predetermined signal;
   a control circuit configured to control switching from the second operation mode to the first operation mode;
   a non-volatile memory storing mode switching permission information; and
   an interface circuit, wherein
   the control circuit is configured to:
      when the input of the first predetermined signal is detected by the detection circuit and the mode switching permission information indicates that the switching from the second operation mode to the first operation mode is permitted in the second operation mode, switch from the second operation mode to the first operation mode, and
      when the input of the first predetermined signal is not detected by the detection circuit and the mode switching permission information indicates that the switching from the second operation mode to the first operation mode is not permitted in the second operation mode, continue the second operation mode,
   the first operation mode is an interface mode in which the interface circuit communicates with an external device, and
   the second operation mode is a normal operation mode in which an oscillation signal is output or a test mode in which the oscillation circuit is inspected.

2. An oscillation circuit that has a first operation mode and a second operation mode, the oscillation circuit comprising:
   a detection circuit configured to detect input of a first predetermined signal;
   a control circuit configured to control switching from the second operation mode to the first operation mode; and
   a non-volatile memory storing mode switching permission information, wherein
   the control circuit is configured to:
      when the input of the first predetermined signal is detected by the detection circuit and the mode switching permission information indicates that the switching from the second operation mode to the first operation mode is permitted in the second operation mode, switch from the second operation mode to the first operation mode, and
      when the input of the first predetermined signal is not detected by the detection circuit and the mode switching permission information indicates that the switching from the second operation mode to the first operation mode is not permitted in the second operation mode, continue the second operation mode, wherein
   the detection circuit is configured to detect input of a second predetermined signal different from the first predetermined signal, and
   the control circuit is configured to:
   when the input of the second predetermined signal is detected by the detection circuit within a predetermined period after a power supply voltage is supplied, switch the operation mode to the first operation mode regardless of the mode switching permission information.

3. The oscillation circuit according to claim 2, wherein a data length of the second predetermined signal is larger than a data length of the first predetermined signal.

4. The oscillation circuit according to claim 1, wherein the operation mode is switched from the first operation mode to the second operation mode when a predetermined command is received from the external device by the interface circuit in the first operation mode.

5. An oscillator, comprising:
the oscillation circuit according to claim 1; and
a resonator coupled to the oscillation circuit.

6. An operation mode switching method of an oscillation circuit, the oscillation circuit having a first operation mode and a second operation mode and including a non-volatile memory, the operation mode switching method comprising:
when input of a first predetermined signal is detected and mode switching permission information stored in the non-volatile memory indicates that switching from the second operation mode to the first operation mode is permitted in the second operation mode, switching from the second operation mode to the first operation mode; and
when the input of the first predetermined signal is not detected and the mode switching permission information indicates that the switching from the second operation mode to the first operation mode is not permitted in the second operation mode, continuing the second operation mode, wherein
the first operation mode is an interface mode in which an interface circuit communicates with an external device, and
the second operation mode is a normal operation mode in which an oscillation signal is output or a test mode in which the oscillation circuit is inspected.

* * * * *